United States Patent [19]

Chiba et al.

[11] Patent Number: 4,486,948
[45] Date of Patent: Dec. 11, 1984

[54] METHOD FOR FORMING LEAD FRAME FOR INTEGRATED CIRCUIT DEVICES

[75] Inventors: Hiroshi Chiba; Shoichi Ogura, both of Tokyo, Japan

[73] Assignees: Nippon Electric Co., Ltd.; Sumitomo Metal Mining Company Limited, both of Tokyo, Japan

[21] Appl. No.: 506,798

[22] Filed: Jun. 22, 1983

Related U.S. Application Data

[62] Division of Ser. No. 293,130, Aug. 17, 1981, Pat. No. 4,415,917.

[30] Foreign Application Priority Data

Aug. 20, 1980 [JP] Japan ................ 55-114185

[51] Int. Cl.³ ............................................ H01R 43/00
[52] U.S. Cl. ............................................ 29/827
[58] Field of Search ............... 29/827, 874; 357/70; 175/52 FP

[56] References Cited

U.S. PATENT DOCUMENTS 3,832,480 8/1974 Bunker ................ 29/827 X
4,012,835 3/1977 Wallick ................ 174/52 FP X

FOREIGN PATENT DOCUMENTS 53-114353 10/1978 Japan ................ 29/874

Primary Examiner—Howard N. Goldberg
Assistant Examiner—Carl J. Arbes
Attorney, Agent, or Firm—Watson, Cole, Grindle & Watson

[57] ABSTRACT

A lead frame for an IC device includes a body element located at its center, the body element including recesses in its outer periphery in which the inner tips of the leads of the lead frame are fitted at predetermined positions. With such an arrangement, the leads are prevented from being deformed during steps of formation of the IC device.

3 Claims, 12 Drawing Figures

METHOD FOR FORMING LEAD FRAME FOR INTEGRATED CIRCUIT DEVICES

CROSS REFERENCE TO RELATED APPLICATION

This application is a divisional application of application Ser. No. 293,130, filed Aug. 17, 1981, now U.S. Pat. No. 4,415,917, issued Nov. 15, 1983.

BACKGROUND OF THE INVENTION

1. FIELD OF THE INVENTION

The present invention relates to lead frames for integrated circuits, and more particularly to lead frames for glass-encapsulated integrated circuits.

2. PRIOR ART

Glass-encapsulated integrated circuits are conventionally assembled by stamping a strip of Alloy 42 into a lead frame having a plurality of leads, then attaching the lead frame to a ceramic substrate coated with glass, then fixing an IC (integrated circuit) chip to the assembly, and finally connecting the tips of the inner ends of the leads of the lead frame to electrodes of the IC chip with wires of aluminum, normally by an automatic bonder. It is important that the tips of the inner ends of the leads of the lead frame which is attached to the ceramic substrate be located in predetermined positions. If the tips are displaced out of position due to deformations, the aluminum wires will not be properly bonded to the displaced tips, and the resulting IC device will be useless. As shown in FIG. 1 of the accompanying drawings, an ordinary conventional lead frame has thin leads which extend toward the center of the frame and are supported only at their outer ends, provides a construction which is mechanically weak and susceptible to deformation. The leads can be easily deformed due to residual stresses created when the lead frame is stamped out of a raw material, or else due to rough handling during subsequent assembling operations. At the same time, as more and more electronic functions are performed by IC, the lead frame must have an increased number of leads which are increasingly thinner and longer and which are hence more easily subject to deformations.

One way to reduce such deformations is disclosed in U.S. Pat. No. 4,137,546 to J. M. Frusco. In this patent a lead frame is shown in which the tips of the inner ends of the leads are spaced apart at intervals by separate tabs. However, these tabs cannot prefectly prevent the leads from being deformed. More specifically, when one of the tabs is subjected to an external force, all of the leads that are connected to that tab will be deformed. In addition, the tabs must be broken off by being bent in a subsequent operation which, however, cannot be mechanically performed due to various difficulties.

It is an object of the present invention to provide a lead frame having leads arranged to resist deformation so that aluminum wires can be reliably connected thereto by an automatic bonder.

SUMMARY OF THE INVENTION

According to the present invention, a lead frame for an integrated circuit is constructed to include a body element which has recesses in which are fitted at least two tips at the inner ends of the associated leads.

Further objects, advantages and features of the present invention will becomes more fully apparent from a detailed consideration of the arrangement and construction of the constituent parts as set forth in the following specification taken together with the accompanying drawings.

DETAILED DESCRIPTION OF THE PREFERRED EMBODIMENT

Figure 1:
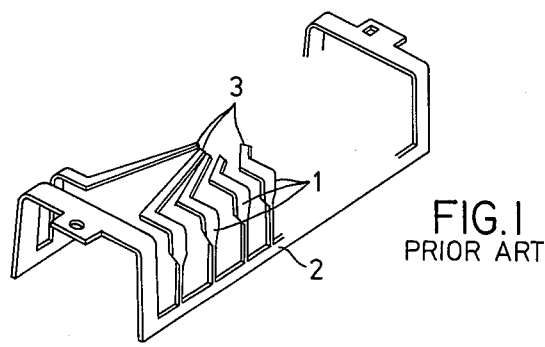
FIG. 1 is a fragmentary perspective view of a conventional lead frame.
Figure 2:
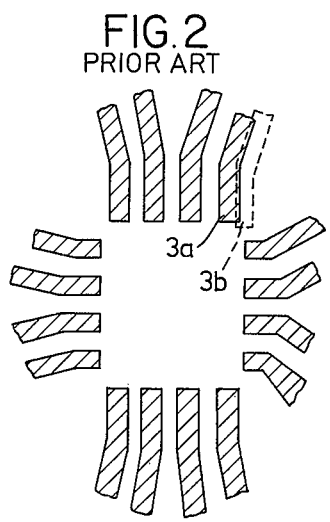
FIG. 2 is a fragmentary plan view of a central portion of a conventional lead frame.

A conventional lead frame, as illustrated in FIG. 1, includes support strips 2 which support leads 1 at their outer ends, their inner ends 3 extending inwardly toward the center of the lead frame (due to their being bent at an angle of about 90 degrees at a point along their length). Due to this mode of support, the inner ends 3 of the leads 1 are positionally unstable and susceptible to deformation. As shown in FIG. 2, the inner ends of the leads are normally arranged in a predetermined spatial relation so as to form a space having a generally rectangular contour. When one of the leads is, however, deformed, its inner tip 3a will be displaced, e.g., to a position shown by the broken-line 3b, such that the inner tip will possibly touch an adjacent inner lead tip or else be directed upwardly. In this event, the wires of aluminum cannot be thereafter properly bonded to these tips by an automatic bonder, e.g., the wires as connected may be short-circuited.

According to the present invention, a body element 5 is positioned at the center of the lead frame, the body element 5 including recesses 4 in its outer periphery in which are fitted the respective tips of the inner ends of the leads 1, the recesses 4 being spaced at predetermined intervals or pitches.

It should be noted that lead frames are normally formed by a stamping press having progressive dies, and at an intermediate processing step the lead frames will have a configuration in which the inner lead tips and a centrally positioned body will be integral with each other. However, the inner lead tips and the body have heretofore been cut off along a broken line 6 as shown in FIG. 3 to provide the desired lead frame.

Figure 3:
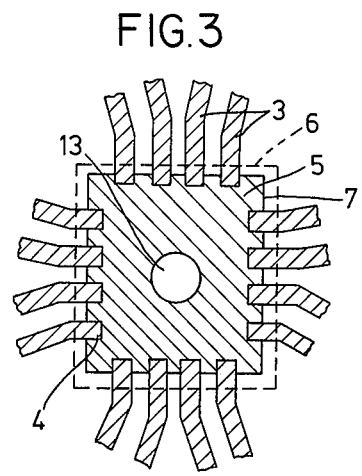
FIG. 3 is a fragmentary plan view of a central portion of a lead frame constructed according to the present invention.

The lead frame of the present invention, on the other hand, can be fabricated by servering the intermediate product along a contour which leaves the extended inner lead tips as shown by the solid line 7 in FIG. 3, thus forming the body element 5 with the recesses 4 in its peripheral sides.

Figure 5:
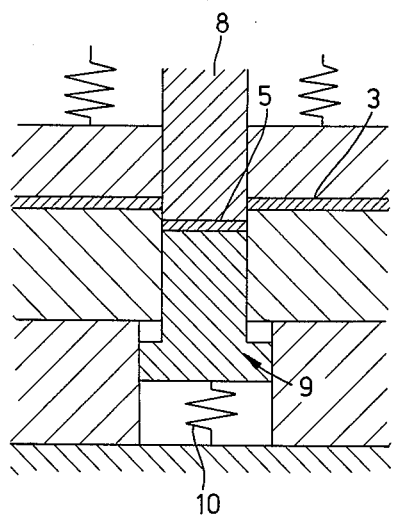
FIGS. 5 and 6 are cross-sectional views illustrative of the way in which a body to be used in the lead frame of the present invention is formed, i.e., in a stamp pressing device.
Figure 6:
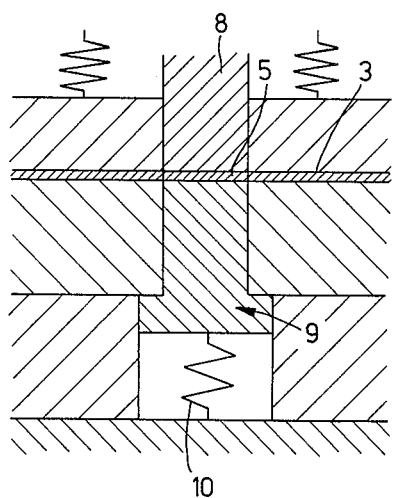
Figure 7:
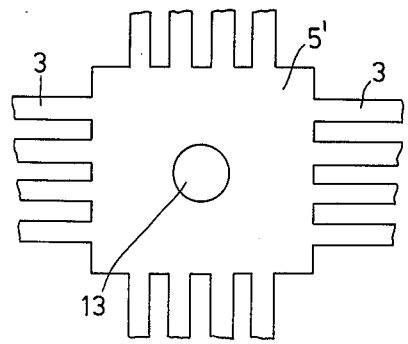
FIG. 7 shows a plan view of the central portion of a unitary structure from which the lead frame according to the present invention can be made by the stamping operations depicted in FIGS. 5 and 6, the central portion including a conventional center body member.
Figure 8:
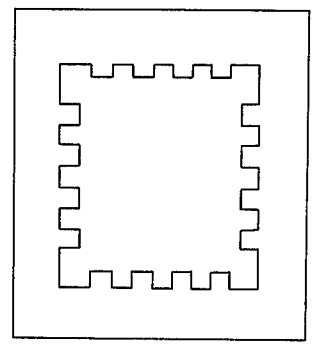
FIG. 8 shows a plan view of the female dies of the stamp pressing device depicted in FIGS. 5 and 6.
Figure 9:
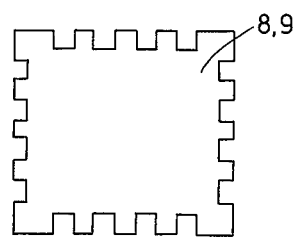
FIG. 9 shows a plan view of the male dies of the stamp pressing device depicted in FIGS. 5 and 6.
Figure 10:
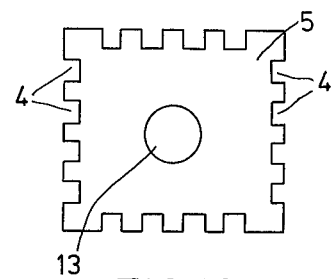
FIG. 10 shows a plan view of the inventive body element with recesses in its periphery after it has been severed from the central portion of the unitary structure as depicted in FIG. 7 by the stamp pressing device operation depicted in FIG. 5.
Figure 11:
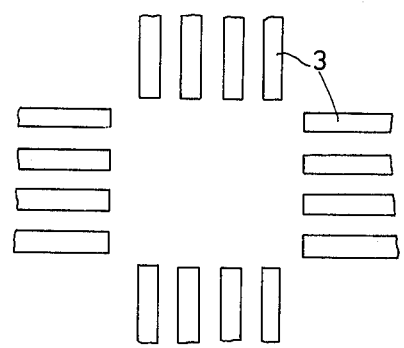
FIG. 11 shows a plan view of the remainder of the central portion of the unitary structure as depicted in FIG. 7 with the body element depicted in FIG. 10 removed therefrom.
Figure 12:
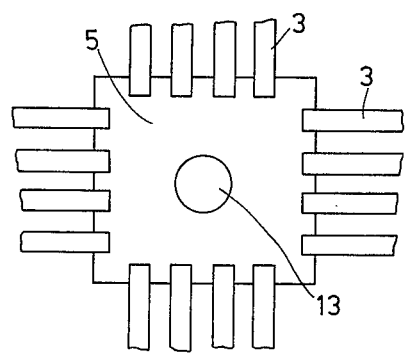
FIG. 12 shows a plan view of the structures depicted in FIGS. 10 and 11 after the body element as depicted in FIG. 10 has been returned to an interfitting relationship with the remainder of the central portion of the unitary structure as depicted in FIG. 11, i.e., by the stamp pressing device operation as depicted in FIG. 6.

More specifically, a unitary structure which has been stamped from a metal strip and which will have a central portion as shown in plan view in FIG. 7, this central portion including a center body member 5' having a central hole 13 and the inner ends 3 of numerous lead elements, is placed in a stamp pressing device as depicted in FIGS. 5 and 6, the female dies therein having a configuration as shown in plan view in FIG. 8 and the male dies having a configuration as shown in plan view in FIG. 9, and the upper male die 8 is moved downwardly to cut stamp out a body element 5 as shown in plan view in FIG. 10, and then is further lowered, the body element 5 becoming sandwiched between the upper male die 8 and the lower male die 9 (see FIG. 5). The body element 5 will be formed with recesses 4 in its periphery. The remaining portion of the unitary structure (which constitutes a lead frame) will be formed such that its lead elements will have inner ends 3 that are extended by the corresponding portions which have been removed from the periphery of the body element 5 (see FIG. 11). When the male die 8 is then lifted, the body element 5 will be raised back by the lower male die 9 due to the force applied thereto by a spring 10 (see FIG. 6), thus relocating the body element 5 into its original position (see FIG. 12). In this position the recesses 4 in the periphery of the body element 5 will surround the extended tips of the inner ends 3 of the lead elements 1 and thus protect the inner ends 3 from unwanted deformations. Such a raising back of the body element 5 is known as "pushback" in the stamping art. By lightly striking the interfitting portions of the lead elements 1, i.e., by lightly striking the extended tips of the inner ends 3 of the lead elements 1 at the locations where they extend into the recesses 4 in the periphery of the body element 5, a better support for the inner ends of the lead elements is obtained.

Figure 4:
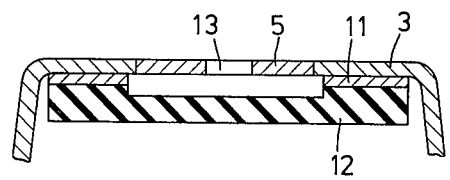
FIG. 4 is a cross-sectional view of the lead frame of the present invention as attached to a ceramic substrate.

The lead frame thus constructed is attached to a ceramic substrate 12 (see FIG. 4) coated with a layer of glass 11, which is melted and solidified to bond the lead frame to the ceramic substrate 12. As the body element 5 and the inner lead tips 3 are held in interfitting engagement with each other, the leads as they are attached to the ceramic substrate 12 will remain positionally and dimensionally the same as when they were stamped out. The body element 5 can be removed from the leads by being pulled out with a suitable tool inserted in the central hole 13. Thus, the lead frame has positionally stable leads to which aluminum wires can be reliably bonded by an automatic bonder.

The present invention is advantageous in that the inner lead tips can be positioned with a high precision, and hence no positional displacement between the inner lead tips and the aluminum wires will occur while being processed with an automatic bonder. There is no possibility of the leads being deformed between the step of manufacturing the lead frame to the step of attaching the latter to the ceramic substrate. Thus, the lead frame can be handled with ease in such processing steps.

While the present invention has been described with reference to particular embodiments thereof, it will be understood that numerous modifications may be made of those skilled in the art without actually departing from the spirit and scope of the invention as defined in the appended claims.

What is claimed is:

1. A method of forming a lead frame whose lead elements are protected against unwanted deformations, said lead frame being useful in the manufacture of an integrated circuit device, said method comprising the steps of
   (1) providing a unitary structure which includes two spaced apart support strips, a central body member located generally between said support strips, and a plurality of lead elements respectively extending between said support strips and said central body member, the outer ends of said lead elements being integrally connected to a respective one of said support strips and the inner ends of said lead elements being integrally connected to said central body member along its periphery,
   (2) servering a portion of said central body member from said lead elements so as to provide a body element whose periphery includes recesses formed therein at locations where the inner ends of said lead elements were previously connected to said central body member and a lead frame whose lead elements include inner ends having extended tips, said extended tips comprising the respective portions of the periphery of said body element which have been removed to provide the recesses in the periphery of said body element,
   (3) moving said body element in a first direction with respect to said lead frame so as to separate the recesses in the periphery of said body element from the extended tips of said lead elements of said lead frame, and
   (4) moving said body element in a second direction opposite to said first direction so as to reposition the recesses in the periphery of said body element around the respective extended tips of the lead elements of said lead frame, thus acting to protect them from unwanted deformations.

2. The method as defined in claim 1 wherein said steps (2) and (3) are simultaneously accomplished by a stamp pressing technique.

3. The method as defined in claim 1 wherein in step (1) said unitary structure is provided by stamping said unitary structure from a strip of metal.

* * * * *